(12) United States Patent
Chu et al.

(10) Patent No.: US 6,875,279 B2
(45) Date of Patent: Apr. 5, 2005

(54) SINGLE REACTOR, MULTI-PRESSURE CHEMICAL VAPOR DEPOSITION FOR SEMICONDUCTOR DEVICES

(75) Inventors: Jack O. Chu, Manhasset Hills, NY (US); Basanth Jagannathan, Beacon, NY (US); Ryan Wayne Wuthrich, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 157 days.

(21) Appl. No.: 09/683,088

(22) Filed: Nov. 16, 2001

(65) Prior Publication Data

US 2003/0094130 A1 May 22, 2003

(51) Int. Cl.[7] ............................................. C23C 16/00
(52) U.S. Cl. .................... 118/715; 118/719; 117/200; 117/84; 117/88
(58) Field of Search .................. 118/715, 719, 118/723 VE; 117/200, 84, 88

(56) References Cited

U.S. PATENT DOCUMENTS

| | | | | |
|---|---|---|---|---|
| 5,180,435 A | * | 1/1993 | Markunas et al. ..... | 118/732 IR |
| 5,210,466 A | * | 5/1993 | Collins et al. .......... | 315/111.21 |
| 5,259,918 A | * | 11/1993 | Akbar et al. .................. | 117/90 |
| 5,298,452 A | * | 3/1994 | Meyerson .................... | 438/508 |
| 5,534,713 A | | 7/1996 | Ismail et al. | |
| 5,783,295 A | * | 7/1998 | Barnett et al. .............. | 428/216 |
| 5,879,467 A | * | 3/1999 | Zhou et al. .................... | 134/19 |
| 6,013,134 A | * | 1/2000 | Chu et al. .................... | 118/715 |
| 6,083,313 A | * | 7/2000 | Venkatraman et al. . | 106/287.14 |

* cited by examiner

Primary Examiner—Nadine G. Norton
Assistant Examiner—Matthew Song
(74) Attorney, Agent, or Firm—Connolly Bove Lodge & Hutz LLP; Myron K. Wyche; Mark Chadurjian, Esq.

(57) ABSTRACT

An apparatus and method for forming at least a portion of an electronic device include a High Vacuum-Chemical Vapor Deposition (UHV-CVD) system and a Low Pressure-Chemical Vapor Deposition (LPCVD) system using a common reactor. The invention overcomes the problem of silicon containing wafers being dipped in HF acid prior to CVD processing, and the problem of surface passivation between processes in multiple CVD reactors.

14 Claims, 3 Drawing Sheets

SINGLE REACTOR, MULTI-PRESSURE CHEMICAL VAPOR DEPOSITION FOR SEMICONDUCTOR DEVICES

BACKGROUND OF THE INVENTION

1. Field of the Invention

This invention relates to semiconductor process equipment and methods, and more particularly, to Chemical Vapor Deposition (CVD) apparatuses and methods for performing a plurality of in situ processes for forming all or portions of an electronic device.

2. Background of the Invention

Present Chemical Vapor Deposition Equipment consists of multiple chambers, gas inlets, gas outlets, vacuum pumps and transfer load-lock systems for inserting, for example, semiconductor wafers into the chambers. Examples of Chemical Vapor Deposition Equipment are described in U.S. Pat. No. 5,259,918 issued on Nov. 9, 1993, which shows an Ultra High Vacuum Chemical Vapor Deposition (UHV-CVD) reactor with a vacuum loading chamber; and in U.S. Pat. No. 6,013,134 issued on Jan. 11, 2000, which shows a UHV transfer system for transferring wafers between a UHV-CVD reactor and a Low Pressure-Chemical Vapor Deposition (LPCVD) reactor. The entire contents of both of these patents are incorporated herein by reference.

In the growth of Si structures of Si/SiGe heterostructures via UHV-CVD processing according to the prior art, a critical step and requirement before loading wafers into the UHV-CVD equipment is to perform a dip of each Si containing wafer into hydrofluoric (HF) acid to remove the native oxide from the wafer surface and to passivate the Si bonds at the surface with hydrogen. Si containing wafers after being dipped in HF acid are loaded into a vacuum loading apparatus of a CVD reactor and then inserted into the CVD reactor. This particular HF cleaning procedure is a hazardous practice to be performed manually under a chemical hood and moreover, for patterned wafers, often there is residual HF liquid left on the wafer surface which would require removal before continuing to process the wafers. Removing residual liquid HF is an extremely hazardous manual process. Presently, this HF-dip is not an industry acceptable process and weakens the acceptance of the UHV-CVD processing technique for doing low temperature epitaxy in the semiconductor manufacturing industry.

Another key issue related to making high performance Si and/or Si/SiGe Metal Oxide Silicon (MOS) field effect transistor (FET) structures and/or Complementary Metal Oxide Silicon (CMOS) structures is the requirement for a very high quality gate dielectric and a gate electrode stack as described in U.S. Pat. No. 5,534,713 by K. Ismail et al. which issued Jul. 9, 1996, and the entire contents of which are incorporated herein by reference. This patent describes a gate dielectric of an ultra-thin $SiO_2$ layer with a thickness from 1 nm to 5 nm. The gate electrode is a heavily doped polysilicon structure.

BRIEF SUMMARY OF THE INVENTION

A typical problem is that reactors and related chambers are built to operate within a limited operating pressure determined by the capacity of mass flow controllers and the speed of the pump package. In many CVD applications, the vapor deposited film is homogeneous, and therefore a single operating point may be adequate. However, in some applications, where the deposited continuous film is made of multiple layers containing varying amounts of alloys, dopants, or other constituents, a variety of operating conditions may prove useful for improving productivity, film quality, and/or process control. For instance, a portion of the deposited film may require UHV-CVD conditions to reduce the defect density and improve process control. However, UHV-CVD deposition of an entire film may be so slow as to be unproductive. On the other hand, non-sensitive portions of a CVD film could be deposited with greater speed by rapidly increasing the operating temperature and pressure, thereby greatly improving the total productivity of a CVD apparatus.

In addition, UHV-CVD processes have generally compromised the productivity of coupled UHV-CVD and LPCVD processes by the steps introduced to satisfy the UHV-CVD segment, which is the most sensitive. Alternatively, the UHV-CVD and the LPCVD processes have been segmented such that the different layers are each grown in a dedicated chamber.

The present invention provides a means to combine elements of the UHV-CVD and LPCVD processes to improve the productivity of a UHV-CVD system. In accordance with the present invention, an apparatus and a method are described for forming the semiconductor portion of CMOS, MODFET's, MOSFET's, MEMT's, NPN's and the like, along with any desired gate structure such as an ultra thin gate oxide and/or with a heavily doped polysilicon gate electrode layer to be subsequently patterned. The apparatus is an Advanced Integrated Chemical Vapor Deposition (AICVD) System having a single reaction chamber that may be operated as part of an Ultra High Vacuum-Chemical Vapor Deposition (UHV-CVD) System, a Low Pressure Chemical Vapor (LPCVD) Deposition System, and a vacuum transfer system for loading wafers from the external ambient. The vacuum transfer system includes a load-lock section for the transfer of wafers from the external ambient to an evacuated section that may remain at vacuum pressures. The evacuated section includes a single tube reactor operated as a Low Pressure/Ultra High Vacuum (LP/UHV) evacuation chamber.

The invention further comprises a low mass, rapid heating furnace in combination with three pumping packages. The three pumping packages are preferably (1) a roots blower backed by mechanical pump, (2) a turbomolecular pump backed by a roots blower and a mechanical pump, and (3) a cryopump backed by a scroll pump. By having three pumping packages communicating with the same reactor tube, each pumping package with the ability to be isolated from the reactor with a corresponding gate valve, operation of the apparatus may be rapidly transitioned from an LP vacuum (100 to 500 mtorr) process to an ultra high vacuum (0.1 to 1.0 mtorr) process. Since the wafers being treated are maintained under a vacuum in the same reactor environment, the transition between depositing sequential film layers may be seamless and defect free, while providing maximum productivity.

The apparatus and method of the invention also provides precise control of transitions from the LPCVD process to the UHV-CVD process to prevent formation of deleterious defects. For this purpose, isolation valves are provided to isolate the roots blowers and mechanical pumps from the reaction chamber until the appropriate pressure has been attained in that chamber. An improvement in this transition is then realized by drawing a vacuum on the chamber with a cryopump to remove any residual water moisture or dopant related contaminants prior to completing the transition to a UHV-CVD process from a LPCVD process. Because of this, there is no need for process steps to "passivate" the Si surface with $H_2$. Instead, the invention maintains an atomically clean surface during transitions between the LPCVD process and the UHV-CVD process by means of reducing the oxidizing agents to insignificant levels using a cryopump.

The cryopump provides particular benefits during the transition from LPCVD to UHV-CVD processes. Although it is possible to transition from LPCVD to UHV-CVD without the cryopump, the environment would be contaminated with residual species from the LPCVD process which are not efficiently removed by a turbomolecular pump The cryopump is proficient at removing $H_2O$, $O_2$, B, As, P, and other species that otherwise could accumulate on the Si surface, react with the Si surface or otherwise degrade the quality or prevent formation of the subsequent epitaxial film. Of particular importance is the transition from moderate epitaxy temperatures (approximately 700 Å ° C.) to low epitaxy temperatures (about 650 Å ° C. or lower) where, if sufficient partial pressures of $O_2$ and $H_2O$ exist, oxides of Si can readily form on the Si surface of the wafer. A cryopump is best suited for this application due to the low volume gas load and the broad range of effectively pumped gases.

The invention further provides methods of using the apparatus arrangements for prebaking a silicon substrate surface in hydrogen, growing a silicon containing layer with a first gas, switching the first gas to a second gas such as $SiH_4$ or $SiH_6$, and reducing the growth temperature to below 400 Å ° C.

The invention further provides methods of using the apparatus arrangements for continuous epitaxial growth on a semiconductor substrate in a single reactor comprising the steps of growing an epitaxial layer on the semiconductor substrate under first growth conditions, interrupting the growth of the epitaxial layer, introducing flowing H2 to provide a reducing environment and then transitioning to UHV-CVD conditions using the combination of the cryopump system and the turbomolecular pump system before lowering the growth temperature below 650 Å ° C. The growth of epitaxial silicon is resumed under second growth conditions achieved by a turbomolecular pumped UHV-CVD process below 650 Å ° C.

The invention further provides changing the first growth conditions to second growth conditions in the same reactor chamber and restarting growth on the surface of the epitaxial layer under the second growth conditions, such as by lowering the temperature below 650 Å ° C. under a cryopump assisted UHV-CVD process.

The invention further provides methods of using the apparatus arrangements for continuous epitaxial growth on a semiconductor substrate in a single reactor comprising the steps of growing an epitaxial layer under first growth (e.g., LPCVD) conditions, interrupting the growth of the epitaxial layer, transitioning to second growth (e.g., UHV-CVD) conditions using the combination of the cryopump and the turbomolecular pump to maintain a controlled gaseous environment before lowering the temperature to a second growth temperature below 650 Å ° C., and restarting continuous growth on the surface of the epitaxial layer under the second growth conditions, such as by flowing a silicon containing gas over the substrate and maintaining the temperature below 650 Å ° C. The controlled gaseous environment herein is an environment that may include hydrogen and exclude contaminants such as $O_2$, $CO_2$, CO, $H_2O$, $CH_4$, and other hydrocarbons and gases such as mentioned as contaminants in U.S. Pat. No. 5,298,452 issued on Mar. 29, 1994, the entire contents of this patent being incorporated herein by reference. The partial pressure of all contaminants are maintained at pressures below $10^{-8}$ Torr.

The invention further provides methods of using the apparatus arrangements for forming a silicon/silicon oxide interface with low interface traps comprising the steps of growing a silicon containing layer on a substrate with a first gas in a reaction chamber at a first growth temperature, switching the first gas to a second gas such as H2 while transitioning to a second growth temperature, introducing a third set of gases such as $SiH_4$ with $NO_2$ or $O_2$, and growing a silicon oxide layer on the surface at the second growth temperature.

The invention further provides methods of using the apparatus arrangements for fabricating silicon containing epitaxial layers comprising the steps of a placing a semiconductor substrate into a reaction chamber, removing any native oxide from the surface of the semiconductor substrate by baking in the range from 850 Å ° C. to 900 Å ° C. for less than 30 minutes with hydrogen gas flowing thereover, forming a medium/high temperature silicon containing epitaxy layer on the surface of the semiconductor substrate at a first growth temperature in the range of 700 Å ° C. to 850 Å ° C. under LPCVD conditions before flowing a hydrogen containing gas in the reaction chamber, followed by transitioning to UHV/CVD conditions using a combination of the cryopump system and the turbomolecular pump system before reducing the reaction chamber temperature to below 650 Å ° C., forming an epitaxial layer on the semiconductor substrate suitable for the channel of a FET or the base of an NPN transistor, maintaining the reaction chamber under a controlled gaseous environment (e.g., $H_2$) while changing it to a third growth temperature and LPCVD conditions forming a gate oxide or base oxide on the upper surface of the semiconductor substrate, maintaining the reaction chamber under a controlled gaseous environment (e.g., $H_2$) while changing it to the fourth growth temperature and UHV/CVD conditions, and forming a heavily doped n or p type polysilicon gate electrode layer over the gate oxide. The n or p type doping may be in the range of $1 \times 10^{20}$ to $1 \times 10^{21}$ atoms/$cm^3$.

The invention further provides methods of using the apparatus arrangements for performing two successive treatment processes comprising the steps of placing a semiconductor substrate into the reaction chamber, performing a first treatment process, transitioning to a controlled gaseous environment (e.g., $H_2$) before lowering the temperature to a second growth temperature below 650 Å ° C., and performing a second treatment process in the reaction chamber. The first and second treatment processes may include growing Si containing layers with different compositions, dopants, growth conditions and the like.

The invention thereby introduces a flexible apparatus and method capable of migrating seamlessly between LPCVD processes and UHV-CVD processes within the same reactor. The invention further introduces a method and apparatus whereby cross contaminants, such as $H_2O$, $O_2$, and the like, and "memory effect" contaminants, such as BPA's, and the like, can be virtually eliminated by including usage of a cryopump to mediate a process transition between coupled UHV-CVD and LPCVD processes.

BRIEF DESCRIPTION OF THE SEVERAL VIEWS OF THE DRAWINGS

These and other features, objects, and advantages of the present invention may be better understood upon consideration of the following detailed description of the invention in conjunction with the accompanying drawings in which.

DETAILED DESCRIPTION OF THE INVENTION

Figure 1:
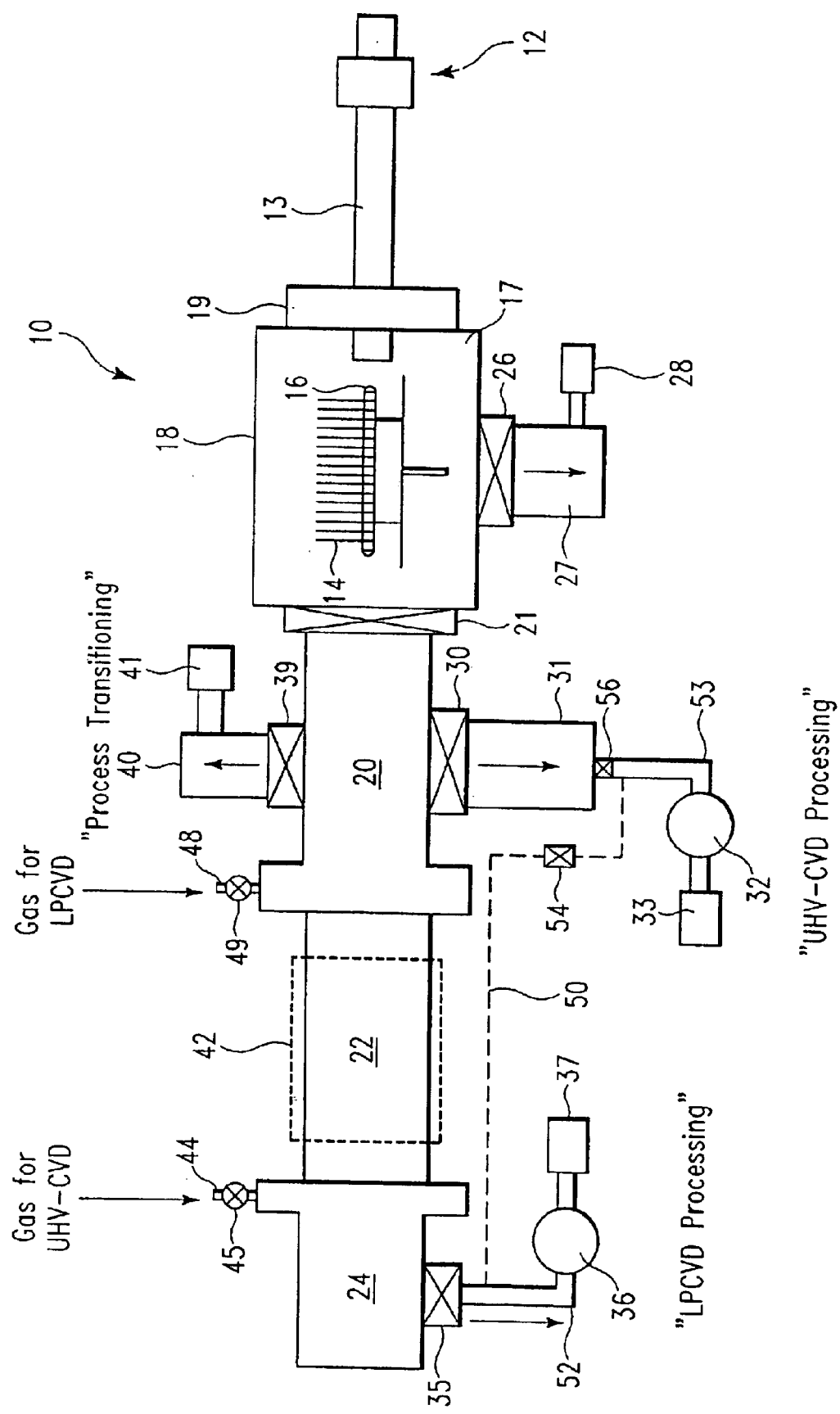
FIG. 1 is a first embodiment of the apparatus of the invention.

Referring to the drawings, FIG. 1 shows an Advanced Integrated Chemical Vapor Deposition (AICVD) System 10 comprising a push/pull transfer system 12 having a transfer arm 13 (including a flange 19) for moving a plurality of wafers 14 in a carrier or boat 16 into a load lock chamber 18 from ambient conditions via a door 17. The load lock chamber 18 is coupled to the reactor chamber 22 for transferring the plurality of wafers 14 between the reactor chamber 22 and the external ambient. The load lock chamber 18 is also coupled to a turbomolecular pump 27 and a mechanical pump 28 in series. After a vacuum is established in load lock chamber 18, the transfer system 12 also moves the boat supported wafers 14 into the reactor 22. The load lock chamber 22 may include plural valves 21 and 26.

An ultra high vacuum level is drawn on the reactor chamber 22 at flange 20 via gate value 30 by a turbomolecular pump 31 in series with a roots blower 32 and a mechanical pump 33. An intermediate level vacuum is drawn on load lock chamber 18 via a gate valve 26 by a turbomolecular pump 27 and a mechanical pump 28 in series. A lower pressure vacuum is drawn at flange 24 via a gate valve 35 by a roots blower 36 and a mechanical pump 37 in series. For transitioning between a LPCVD process and a UHV-CVD process (and vice versa) and for removing contaminants generated by these processes, a vacuum is drawn at flange 20 via a gate valve 39 by a cryopump 40 and a scroll pump 41 in series.

While an ultra high vacuum is being drawn at UHV flange 20 and CVD reaction chamber 22 by the pumps 31, 32 and 33, the wafers 14 are positioned in CVD reaction chamber 22 and are heated by a surrounding furnace 42. Upon attaining the appropriate UHV-CVD temperature, the wafers are treated with a UHV-CVD gas passing through chamber 22 from a gas inlet 44 having an isolation valve 45. While a low pressure vacuum is being drawn at flange 24 and CVD reaction chamber 22 by a roots blower 36 and a mechanical pump 37, the wafers 14 are positioned in chamber 22, are heated with the furnace 42 to an appropriate LPCVD temperature, and are treated with a LPCVD gas passing through chamber 22 from an inlet 48 having an isolation valve 49. One or more of the mechanical pumps 28, 33, and 37 also may be a scroll-type pump.

A first pumping system comprises the roots blower 36 in series with the mechanical pump 37. A second pumping system is the series combination of the turbo pump 30, the roots blower 32 and the mechanical pump 33. A third pumping system comprises the cryopump 40 and the scroll pump 41. As an alternative, the need for separated pumps 36 and 37 may be eliminated by the addition of an interconnecting blower conduit 50 between conduits 52 and 53 so that roots blower 32 and mechanical pump 33 may serve as the first pumping system when valve 54 in conduit 50 is opened and valve 56 in conduit 53 is closed.

For the purpose of transitioning between a LPCVD process and a UHV-CVD process (and vice versa), the surface of the semiconductor wafers 14 may first be blanketed with hydrogen gas introduced through the inlet 44 if the wafers are transferring from an LPCVD process, or introduced through inlet 48 if the wafers are transferring from a UHV-CVD process. After each gaseous treatment process, the chamber 22 may also be purged with hydrogen or another purge gas introduced through inlet 44 or preferably through both inlets 44 and 48. After such blanketing and/or purging steps, the cryopump 40 and the scroll pump 41 may be operated to remove any remaining contaminants from the preceding treatment process, along with any remaining blanket and/or purging gases. The contaminants may include water vapor, dopant, $O_2$, $CO_2$, CO, $CH_4$, and other hydrocarbon gas other than $CH_4$.

As another alternative the third pumping system may comprise a cyrogenic pump for removing contaminants. The cyrogenic pump may further include a cold trap for removing at least a portion of the contaminants from the reaction chamber 22.

Figure 2:
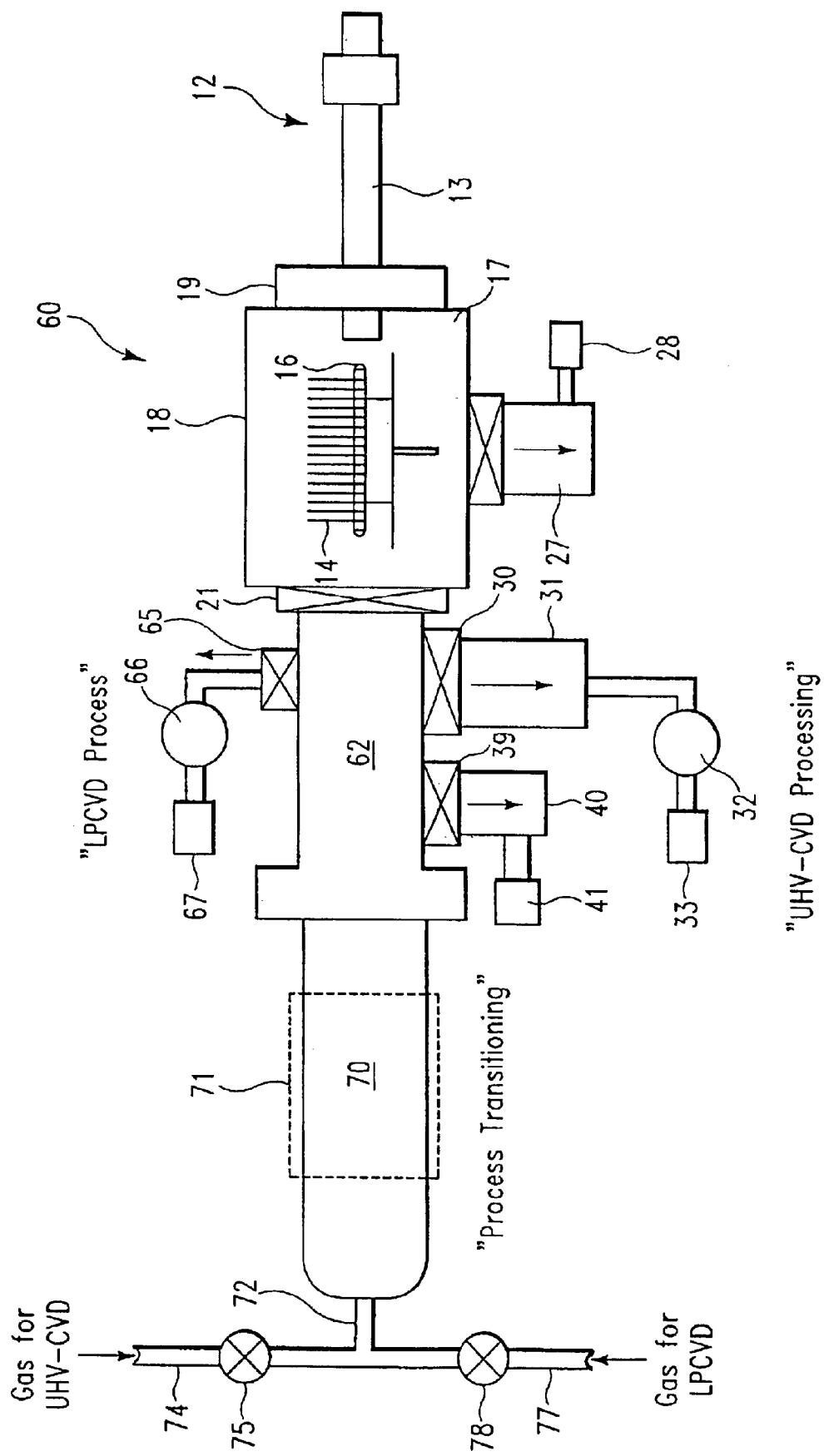
FIG. 2 is a second embodiment of the apparatus of the invention.

In the alternative embodiment of the apparatus shown in FIG. 2, the Low Pressure (LP) evacuation flange 24 of FIG. 1 has been eliminated by using a combined LP-UHV flange 62. Attached to the combined flange 62 is the same load lock chamber 18 and the same UHV pumping system and transition pumping system as in FIG. 1, and therefore the components of these systems bear the same numerical designations as in FIG. 1. In the alternative AICVD system 60 of FIG. 2, the LP vacuum is drawn on the combined flange 62 via a gate valve 65 by roots blower 66 and a mechanical pump 67. The end of combined flange 62 opposite to load lock chamber 18 is connected to a reaction chamber 70 surrounded and heated by a furnace 71.

The gases for treating the wafers 14 in reaction chamber 70 are fed through a common gas inlet 72, which in turn is connected to a UHV-CVD gas inlet line 74 having an isolation valve 75, and to a LPCVD gas inlet line 77 having an isolation valve 78. Blanket gases and purge gases may also be fed to the reaction chamber 70 through the common gas inlet 72 via either or preferably through both of the inlet lines 74 and 77. In the AICVD system 60, the wafers 14 are heated in reaction chamber 70 for any elevated temperature portions of either a LPCVD process or a UHV-CVD process.

The Advanced Integrated Chemical Vapor Deposition (AICVD) systems 10 and 60 are based upon growth interrupt experiments and results which indicate that continuous growth of a silicon containing layer after an interruption of growth conditions is possible without any material quality degradation, as long as the wafers have an atomically clean surface which is maintained throughout the growth interrupt period and/or during a change between growth processes. The H2 pre-bake may also produce wafer surface passivation, which is believed to be the termination of atomic bonds on the surface, such as Si bonds, with hydrogen. The results of growth interrupt experiments are shown and described in U.S. Pat. No. 6,013,134 referenced above.

In the operation of AICVD systems 10 and 60, wafers which may have some native or chemical oxide thereon are loaded into the reaction chamber to first remove the native oxide from the silicon or silicon containing surface by employing a $H_2$ pre-bake at a temperature in the range from 800 Â ° C. to 950 Â ° C. for less than 30 minutes. Immediately after this pre-bake, a silicon containing gas is flowed through the reaction chamber at a medium/high temperature of 700 Â ° C. to 950 Â ° C. to immediately grown a medium/high temperature silicon epitaxial layer, after which the growth temperature is reduced to a second growth temperature below 650 Â ° C. and pressure, UHV-CVD mediated by the cryopump. The foregoing process steps negate the need for the ex-situ prior art cleaning step of dipping the wafers in HF acid as mentioned above.

Figure 3:
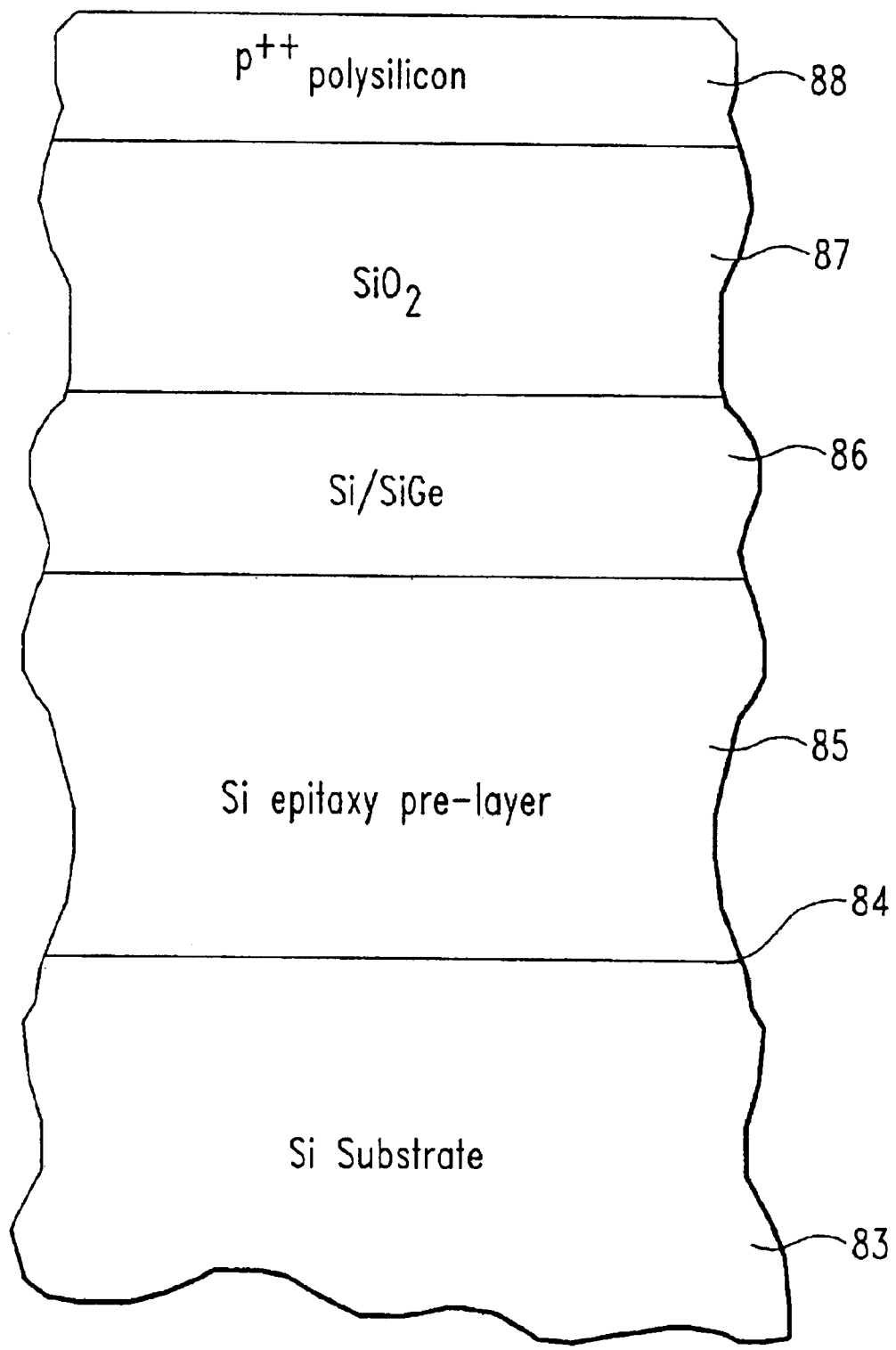
FIG. 3 is an illustration of the layers of a high performance Si and/or SiGe CMOS device structure.

In the reaction chamber, the entire Si and/or SiGe CMOS device structure may be formed as shown in FIG. 3. The CMOS device structure may be composed of a graded up structure as described in U.S. Pat. No. 5,534,713 by Ismail et al., which is incorporated herein by reference, followed by both the p- and n-type modulation doped structures which can now be grown over the surface of the silicon containing layer using UHV-CVD processing. Since these active device channels may be at least 5000 Â . . . from the actual growth interface, which is 100 times more than required, no degradation whatsoever is to be expected in the device performance from these SiGe CMOS heterostructures.

After completion of the Si and/or SiGe CMOS device structures, the wafers can then be subjected to growth conditions wherein a gate oxide in the range from 1 nm to 5 nm can be grown in the low temperature range from 400 Â ° C. to 650 Â ° C. With the gate oxide process completed, the wafers can then be subjected to growth conditions wherein a heavily doped p++ polysilicon gate layer may be grown over the thin gate oxide layer, which will serve to maintain the oxide quality and thickness uniformity, as well as a completed gate stack structure.

A standard polysilicon layer may also be grown using reaction conditions providing very high in situ boron doping levels ranging from $10^{20}$ to $10^{21}$ atoms/cm$^3$. These conditions are not readily achievable in a LPCVD. However, in AICVD systems 10 and 60, integrated processing conditions and procedures may be used for fabricating any high performance Si and/or SiGe device structure with a high quality gate stack.

EXAMPLE 1

A method of operation for the AICVD system 60 shown in FIG. 2 would provide the following processes to fabricate any high performance Si and/or SiGe device structure, such as shown in FIG. 3.

Start with wafers 14 having a Si substrate 83 outside of the AICVD 60 after cleaning the wafers using a standard Huang or RCA cleaning process well known in the art.

Load the cleaned wafers 14, which may be supported on the boat 16, into the load lock chamber 18, and then transfer the wafers on boat 16 into the quartz tube reactor 70 after opening gate valve 21 and operating roots blower 66 and mechanical pump 67 to provide an LPCVD pressure environment.

Under a blanket of $H_2$, pre-bake wafers 14 in the temperature range from 800 Â ° C. to 950 Â ° C. for 5 to 30 minutes at a process pressure of 100–500 mtorr to remove native oxides and prepare silicon surface 84.

Activate the Dichlorosilane (DCS) source, cease $H_2$ flow, and grow the Si epitaxial pre-layer 85 to a desired film thickness under LPCVD conditions, with temperatures between 700 Â ° C. and 950 Â ° C.

Cease DCS flow and purge with $H_2$ for 5 minutes or less.

Reduce $H_2$ flow, open gate valve 30, and activate the turbomolecular pump 31, roots blower 32 and mechanical pump 33, and allow the pressure to stabilize at between 0.1 and 10 mtorr.

Cease $H_2$ flow, close gate valve 30, open gate valve 39, and activate cryogenic pump 40 and scroll pump 41; and upon reaching a base pressure of $10^{-8}$ mtorr or less, rapidly cool to the low temperature epitaxy growth temperature.

Close gate valve 65 to the cryogenic pump, initiate silane flow, and operate the reactor 70 according to the UHV-CVD system described by B. S. Meyerson in U.S. Pat. No. 5,298,452, issued Mar. 29, 1994, to grow a Si, Ge and/or SiGe layer 86 (a low temperature epitaxial film).

When the low temperature epitaxial film 86 is complete, cease process gas flow, introduce $H_2$, modify the process temperature as necessary to the range less than 650 Â ° C., gradually increase $H_2$ flow until the reactor pressure is about 10 mtorr, and close gate valve 30 to the reactor turbomolecular pump 31.

Open gate valve 65 to the reactor roots blower 66 and start this blower and mechanical pump 67 when the pressure has reached 100 to 500 mtorr.

At 100 to 500 mtorr, grow a low temperature thermal oxide layer 87 by introducing SiH4 with $NO_2$ or $O_2$, under LPCVD conditions. Alternatively, a silicon dioxide layer 87 may be formed using tetra ethylortho silicate (TEOS), which is well-known in the art.

Cease process gas flow, introduce a $H_2$ purge flow for less than 5 minutes and at a temperature of between 400 Â ° C. and 650 Â ° C. Reduce $H_2$ flow, open gate valve 30 and activate the turbomolecular pump 31, roots blower 32 and mechanical pump 33 and allow pressure to stabilize between 0.1 and 10 mtorr and a temperature between 400 and 650 Â ° C. Grow a P+ or P++ polysilicon film layer 88 using $SiH_4$ and Diborane ($B_2H_6$).

Cease process gas flow, introduce $H_2$ as a cover gas, transfer the wafers 14 to the load chamber 18 under LPCVD conditions, and remove product wafers from chamber 18 after raising its pressure to ambient.

A method of operation for the AICVD system 10 shown in FIG. 1 is essentially the same as described above for the AICVD system 60, except UHV-CVD process gases and LPCVD process gases are fed into the reactor 22 from opposite ends of this reactor, and LPCVD pressures are provided through the LP flange 24 instead of through a combined LP/UHV chamber, such as chamber 62 in FIG. 2.

While there has been described and illustrated two apparatuses using advanced integrated chemical vapor deposition for fabricating semiconductor devices with LPCVD and UHV-CVD processes involving interrupted growth of the semiconductor layers, it will be apparent to those skilled in the art that modifications and variations are possible without deviating from the broad scope of the invention, which is to be limited solely by the scope of the claims set forth below.

What is claimed is:

1. An apparatus for forming at least a portion of a semiconductor device, said apparatus comprising:

a reaction chamber for heating a substrate on which the semiconductor device is to be formed;

a load lock chamber for transferring said substrate between said reaction chamber and an external ambient;

a flange having a first end connected to said reaction chamber and a second end connected to said load lock chamber;

a first source for supplying a first treating gas to said reaction chamber;

a first pumping system connected to said flange for maintaining said reaction chamber at a first vacuum pressure during the supplying of said first treating gas;

a second source for supplying a second treating gas to said reaction chamber;

a second pumping system connected to said flange for maintaining said reaction chamber at a second vacuum pressure during the supplying of said treating gas, said second vacuum pressure being lower than said first vacuum pressure;

a third pumping system for transitioning said reaction chamber between said first vacuum pressure and said second vacuum pressure; and a valve connected to said second end of said flange for isolating said lock chamber from said first, second and third pumping systems.

2. An apparatus according to claim 1, wherein said reaction chamber, said first source and said first pumping system form at least part of a Low Pressure Chemical Vapor Deposition (LPCVD) system.

3. An apparatus according to claim 2, wherein said reaction chamber, said second source and said second pumping system form at least part of an Ultra High Vacuum-Chemical Vapor Deposition (UHV-CVD) system.

4. An apparatus according to claim 3, further comprising a first pumping system coupled to one end of said reaction chamber and forming therewith a portion of said LPCVD system, and a second pumping system coupled to another end of said reaction chamber and forming therewith a portion of said UHV-CVD system; wherein said first pumping system is also coupled to a roots blower and a mechanical pump in series; and wherein said second pumping system is also coupled to a turbomolecular pump, a roots blower and a mechanical pump in series.

5. An apparatus according to claim 4, wherein said third pumping system is coupled to said reaction chamber and comprises a cryopump in series with a scroll pump for removing contaminants from said reaction chamber.

6. An apparatus according to claim 1, wherein said load-lock chamber also being coupled to a turbomolecular pump and a mechanical pump in series.

7. An apparatus according to claim 1, wherein said third pumping system comprises a cryopump and a scroll pump arranged in series to remove contaminates from said reaction chamber after the supplying of said first treating gas.

8. An apparatus according to claim 1, wherein said reaction chamber, said first source and said first pumping system form at least a part of a Low Pressure Chemical Vapor Deposition (LPCVD) system for prebaking said substrate in a hydrogen containing gas and for forming silicon containing layers on said substrate; and wherein said reaction chamber, said second source and said second pumping system form at least part of an Ultra High Vacuum-Chemical Vapor Deposition (UHV-CVD) system for forming germanium (Ge), silicon (Si) or SiGe containing layers on said substrate.

9. An apparatus according to claim 1, wherein said first pumping system comprises a roots blower and a mechanical pump in series.

10. An apparatus according to claim 1, wherein said second pumping system comprises a turbomolecular pump, a roots blower and a mechanical pump in series.

11. An apparatus according to claim 1, wherein said third pumping system comprises a cryopump and a scroll pump in series.

12. An apparatus according to claim 1, wherein said first pumping system comprises a roots blower and a mechanical pump in series; wherein said second pumping system comprises a turbomolecular pump, a roots blower and a mechanical pump in series; and wherein said first pumping system and said second pumping system share the same roots blower and mechanical pump.

13. An apparatus according to claim 1, wherein said third pumping system is connected to said flange.

14. An apparatus according to claim 1 further comprising a second flange connected to said reaction chamber, wherein said third pumping system is connected to said second flange.

* * * * *